(12) United States Patent
Gunda et al.

(10) Patent No.: US 11,886,260 B2
(45) Date of Patent: Jan. 30, 2024

(54) THERMAL MANAGEMENT OF STORAGE DEVICES INCREASING HOST WRITE PERFORMANCE

(71) Applicant: Western Digital Technologies, Inc., San Jose, CA (US)

(72) Inventors: Sridhar Prudviraj Gunda, Karnataka (IN); Kiran Kumar Eemani, Karnataka (IN); Praveen Kumar Boda, Karnataka (IN)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 10 days.

(21) Appl. No.: 17/748,336

(22) Filed: May 19, 2022

(65) Prior Publication Data
US 2023/0400899 A1 Dec. 14, 2023

(51) Int. Cl.
*G06F 1/20* (2006.01)
*G06F 12/02* (2006.01)

(52) U.S. Cl.
CPC ............ *G06F 1/206* (2013.01); *G06F 12/023* (2013.01); *G06F 2212/1032* (2013.01)

(58) Field of Classification Search
CPC ....... G11C 7/04; G06F 1/206; G06F 11/3058; G06F 3/061; G06F 11/3034; G06F 11/3037; G06F 12/023; G06F 12/0238; G06F 12/0246; G06F 3/3287; G06F 9/5094; G01K 7/425; G01K 365/211; G01K 365/212; G01K 711/17; G01K 711/165; G01K 713/10
See application file for complete search history.

(56) References Cited

U.S. PATENT DOCUMENTS

| | | | |
|---|---|---|---|
| 9,355,929 B2 * | 5/2016 | Tzafrir | G11C 16/3418 |
| 9,811,267 B1 * | 11/2017 | Yang | G11C 16/26 |
| 9,946,481 B2 | 4/2018 | Warriner | |
| 11,016,545 B2 | 5/2021 | Yang et al. | |
| 2014/0101371 A1 | 4/2014 | Nguyen et al. | |
| 2014/0304444 A1 | 10/2014 | Walker et al. | |
| 2015/0046637 A1 | 2/2015 | Chien et al. | |
| 2016/0078907 A1 * | 3/2016 | Woo | G06F 3/0619 711/162 |
| 2017/0285699 A1 * | 10/2017 | Ahuja | G06F 1/206 |
| 2018/0350410 A1 * | 12/2018 | Curtis | G06F 9/5094 |
| 2019/0043559 A1 * | 2/2019 | McVay | G06F 3/0634 |
| 2019/0050153 A1 * | 2/2019 | Yang | G06F 3/0679 |

(Continued)

*Primary Examiner* — William E. Baughman
(74) *Attorney, Agent, or Firm* — ARENTFOX SCHIFF LLP

(57) ABSTRACT

Aspects of a storage device are thermal management of a non-volatile storage device are provided. In various embodiments, a storage device includes corresponding memory locations on two or more dies. Corresponding memory locations on each die form an addressable group. A controller in thermal communication with each of the dies may detect an excess temperature on one of the dies while performing sequential host writes. Upon such detection, the controller may disable all writes to the detected die while continuing to perform writes to the memory locations of the other dies without throttling the other dies. The controller may then reactivate writes to the detected die when the temperature drops below a threshold.

20 Claims, 9 Drawing Sheets

(56) References Cited

U.S. PATENT DOCUMENTS

| | | | |
|---|---|---|---|
| 2021/0132817 A1* | 5/2021 | Bhat | G06F 11/3037 |
| 2022/0188208 A1* | 6/2022 | Gutierrez | G06F 9/30079 |
| 2023/0266909 A1* | 8/2023 | Kale | G06F 3/0679 |
| | | | 711/154 |

* cited by examiner

THERMAL MANAGEMENT OF STORAGE DEVICES INCREASING HOST WRITE PERFORMANCE

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

Thermal throttling in a multi-die non-volatile storage (NVM) device is a conventional process by which high performance causes at least one die(s) to dissipate heat that in turn may cause the die(s) to reach or exceed a threshold temperature. To avoid thermal breakdown, the host may set thermal constraints in addition to internal limits such as reducing speed on all the dies to proceed, but with sub-maximal performance. In the case of an extended workload such as multiple successive host writes, it is likely that the storage device will switch back and forth between power states, resulting in performance oscillation and overall performance degradation.

SUMMARY

One aspect of a storage device is disclosed herein. The storage device includes a plurality of dies each comprising a plurality of memory locations. Each corresponding memory location from each die forms an addressable group such that a plurality of addressable groups traverse the plurality of dies. The storage also includes a controller in thermal communication with each of the dies. The controller is configured to detect an excess temperature on at least one of the dies while performing sequential host writes. The controller thereupon is configured to disable all writes to the detected at least one die while continuing to perform writes to the memory locations of the other dies corresponding to one or more of the addressable groups. The controller is also configured to reactivate writes to the at least one detected die when the temperature drops below a threshold.

Another aspect of a storage device is disclosed herein. The storage device includes a plurality of dies. Each of the dies includes a positive integer n sets of memory locations. A corresponding one of the n sets from each die is coupled together to form one meta-set of n meta-sets. Each meta-set includes a maximum addressable unit of a host input/output (I/O) operation. The storage device also includes a controller in thermal communication with each of the dies. The controller is configured to detect an excess temperature on at least one of the dies while performing a sequence of host writes. The controller is also configured to disable all writes to the detected at least one die while continuing the host writes to the other dies in the corresponding one or more of the n meta-sets. The controller is further configured to re-activate writes to the at least one detected die when the temperature drops below a threshold.

A further aspect of a storage device is disclosed herein. The storage device includes a plurality of dies each comprising a memory location forming one of a plurality of selectively addressable pages. The storage device includes a controller coupled to each of the plurality of dies. The controller is configured to perform a host write operation to one or more pages and detect an excess temperature on at least one of the dies. The controller is configured to disable, responsive to the detection, all writes to the at least one detected die while continuing to perform writes to the memory locations of the other dies. The controller is configured to reactivate writes to the at least one detected die when the temperature drops below a threshold.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
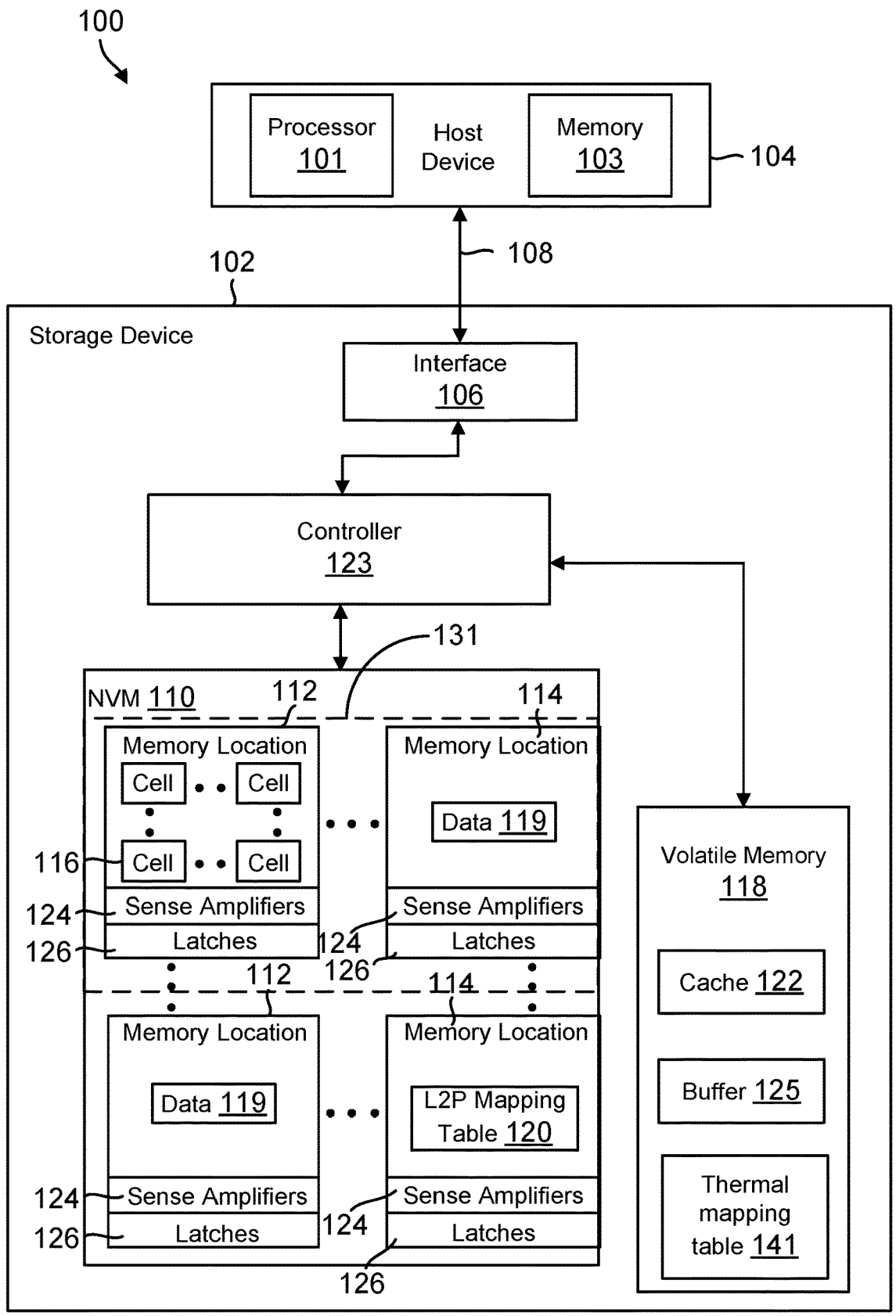
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Thermal throttling in conventional non-volatile memory (NVM) devices includes operating die(s) within a temperature constraint while maximizing performance. As noted above, during periods of intense performance such as sustained sequential writes (SSWs) or continuous host (I/O) writes and other operations like data relocation (including folding and compaction), high performance causes high power which eventually causes at least one of the die in a multi-die memory system to exceed a power or temperature threshold. In the multi-die storage device, when at least one die exceeds the temperature limit, all dies are throttled—for example, their (I/O) performance is reduced by an amount proportional to the temperature increase—to assist in reducing the temperature before it reaches its upper limits, such as during periods of extreme or continuous activity. In the case of extreme workloads, the absence of throttling can cause severe performance degradation.

Data during host writes is written to a meta page in a meta block, which may span across multiple dies. For example, the meta block may be a maximum or subset of maximum addressable units on a multi-die storage device. A meta die may be formed with four dies across four flash interface modules (FIMs), and with each FIM spanning across one die. In other arrangements, a jumbo die may be formed with sixteen (16) dies across four FIMs, with each FIM spanning across four dies. Other configurations and deployments involving different numbers of dies and/or FIMs are also possible.

As noted, a plurality of meta pages within the meta block may therefore constitute a jumbo page. However, for specific purposes of this disclosure, meta pages within the meta block also be referred to herein broadly as a meta-set in which a single write across two or more sets (dies) may be performed simultaneously. Also, for purposes of this disclosure, data may be referred to as being written to (or not written to) one or more dies, which simply means that data is written to one or more memory locations or sets on that die. Each die may be associated with a flash interface module (FIM), which can be assembled into a larger storage device having arrays of multiple dies.

One such example of conventional throttling on multi-die storage devices includes heavy write loads placed on NVM devices such as NAND memory, NOR memory, and other forms of SSD or flash NVM memory. The respective temperatures of the dies increase as performance increases, until typically at least one die meets or exceeds an upper temperature threshold. This in turn precipitates the need for throttling. Throttling may be initiated by the host device in some cases in response to thermal information from an infrastructure module or other source on the storage device. Conventionally, responsive to commands from the host device, the storage device thereupon may initiate throttling across all the meta-dies, which is a deliberate decrease in performance with the objective of restoring acceptable temperatures within the dies while continuing to respond to new (I/O) commands, folds, or the like.

In the above conventional example, it is assumed that a page or other group ("set") of one or more memory locations on each die form an individually addressable meta-page within a meta block that spans six dies. It is further assumed that die 3 increases in temperature. Once the controller detects (e.g., via the thermal infrastructure module or otherwise) that at least one of the dies has met a threshold, the host controller or the controller on the storage device, responsive to notification of the increase on die 3, may initiate throttling on die 3. Thus, due to the temperature raise on die 3, the host or storage controller initiates a slowdown of host writes across all dies. This in turn causes an overall slowdown of host writes to allow the cooling of the temperature on die 3. The temperature increase on die 3 thus hampers write performance on all dies. For example, the performance of successive host writes or other actions may reduce to 50% or more across all dies, until the temperature of die 3 returns to a normal range for the operation in question (e.g., host writes). In some cases, die 3 may include one or more dies that exceed temperature thresholds.

Depending on the memory technology and configuration, the amount of throttling initiated may vary based on whether the at least one die has crossed light, heavy, or extreme performance, or some measure in between. At higher temperatures, more restrictive throttling is conventionally applied across all dies, to continue performing writes and other operations, albeit using slower speeds that are commensurate with the excess temperature of the at least one of the dies involved.

The inventors have found a superior method for handling writes and other input/output (I/O) operations or internal relocation, etc. in the face of excess heat and temperature caused by excessive or extreme performance. The approaches described herein produce much less degradation in overall performance and with higher overall write performance, for example. In one aspect of the disclosure, during a detected temperature raise of any of the die(s) that meets or exceeds a temperature threshold, instead of a global slowdown of the writes across the meta-block or meta-sets, the controller (at the behest of the host or independently) skip writes only to the specific die(s) whose temperature(s) have exceed the threshold. The controller will continue to execute write operations at full speed, without throttling, to all the other dies, until the temperature of the disabled die(s)

returns to normal operating temperature, or at least an acceptable value. During disablement of the die(s), performance of the remaining dies may be utilized at 100%. After the die(s) is restored, full performance at maximum capacity may be restored including all meta pages in the meta block(s).

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123. In other embodiments, one or more firmware modules may be integrated into the controller. The controller 123 may also perform various functions associated with the flash translation layer (FTL), in deployments where such an FTL is implemented.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

The area enclosed by the dashed lines at of NVM 110 includes an infrastructure module 131 that is in communication with controller 123 and thermal mapping table 141. The infrastructure module 131 or the controller 123 may store information relating to die temperatures in the thermal mapping table 141 in volatile memory.

In some configurations, the infrastructure module may span across all die locations, although only a portion is shown to avoid unduly obscuring the example of FIG. 1. The infrastructure module 131 may be in thermal communication with each die and may relay the temperature of each die to controller 123. In turn, the controller may, where desired in some implementations, transfer this data to the host device 104. In other arrangements, the controller may transfer temperature data only with respect to one or more dies that have exceeded a preconfigured threshold, e.g., stored in a portion of NVM. The controller 123 may store this information in thermal mapping table 141.

Figure 2:
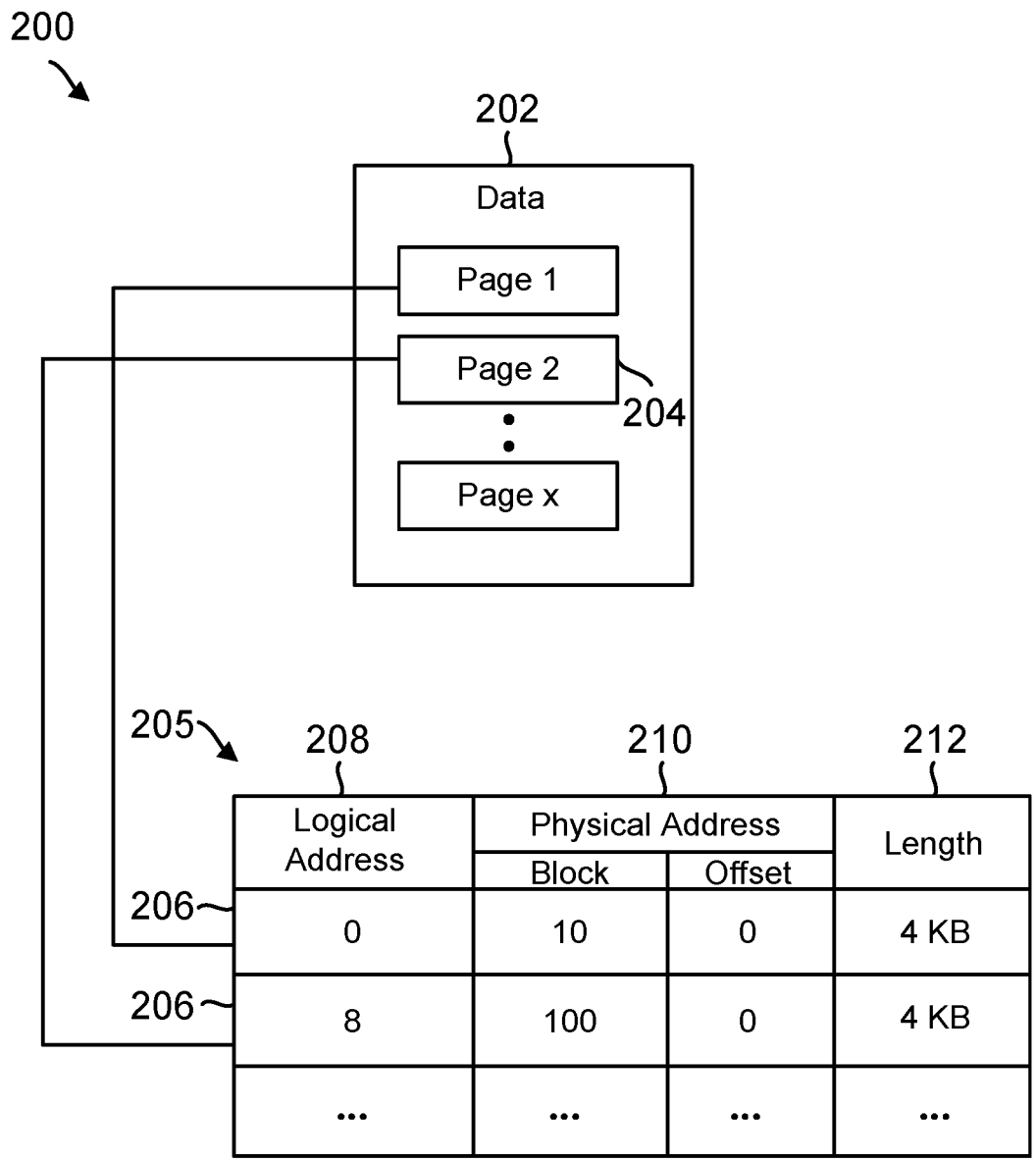
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
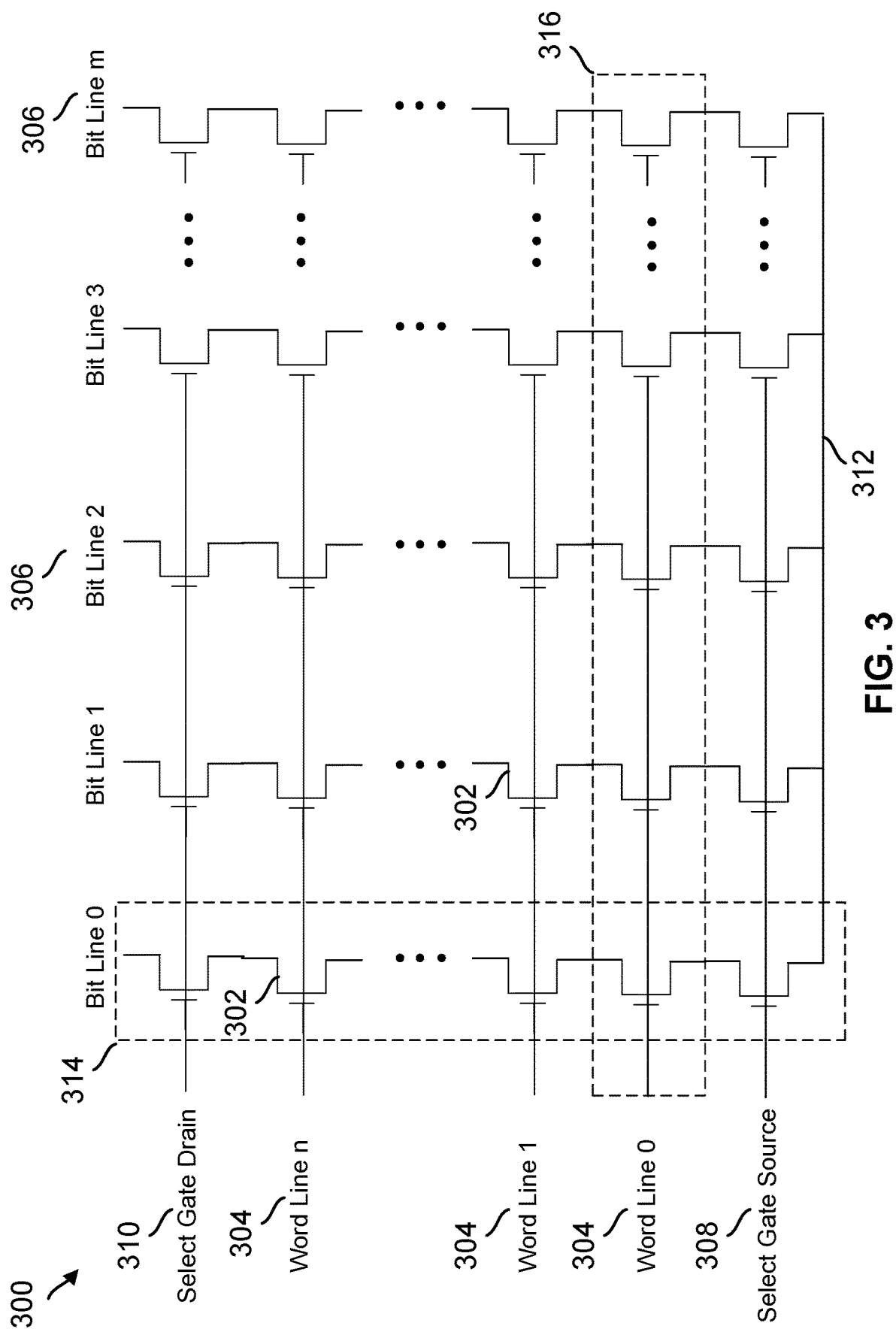
FIG. 3 is a conceptual diagram illustrating an example of an transistor-level array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-$n$ may each be associated with their own row address (e.g. word line 0 may correspond to word line address 0, word line 1 may correspond to word line address 1, etc.), and bit lines 0-$m$ may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
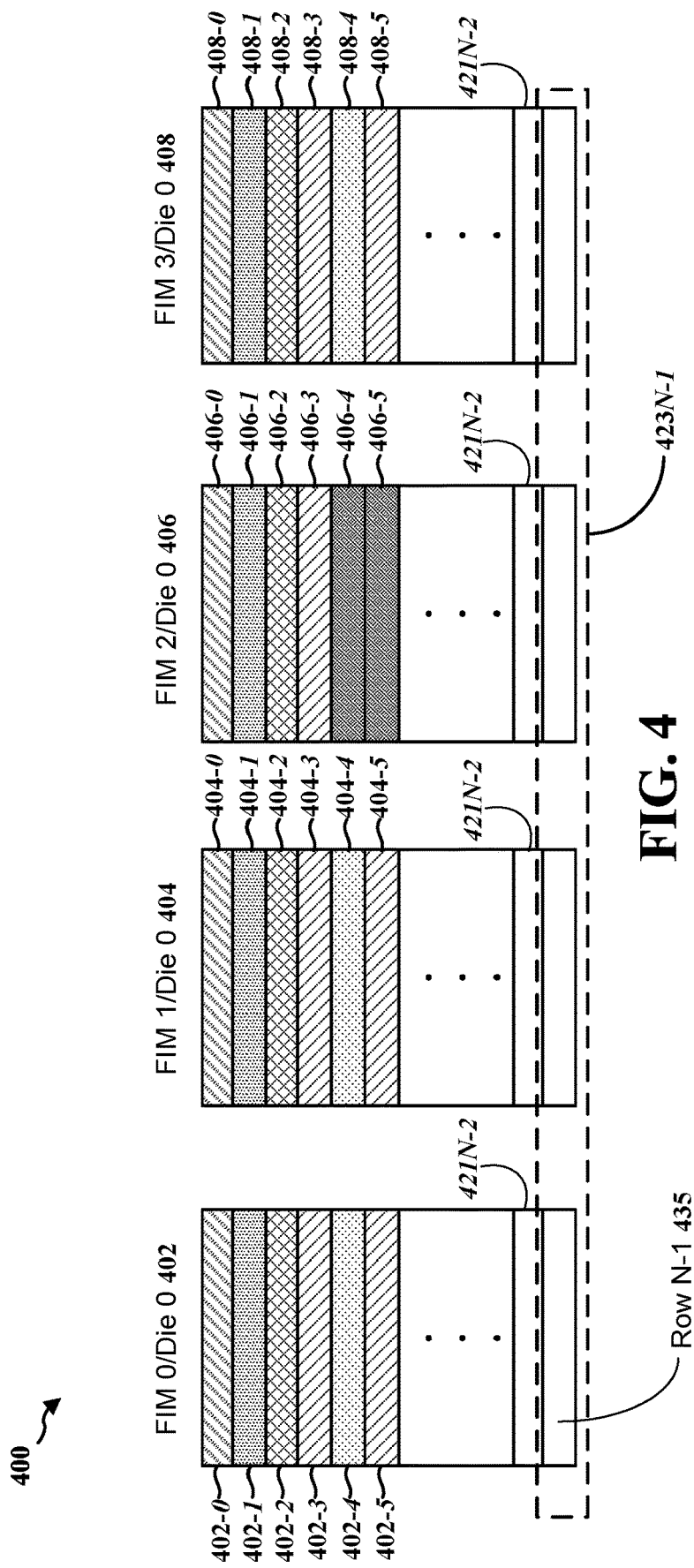
FIG. 4 is a conceptual diagram illustrating an example of an array of memory cells in the storage device of FIG. 1.

FIG. 4 is a conceptual diagram 400 illustrating an example of an array of memory cells in the storage device of FIG. 1. Each die 402, 404, 406, and 408 in this example may be associated with a respective flash interface module (FIM 0, FIM 1, FIM 2, FIM 3). Four total dies are therefore shown in this illustration, although that number may be any number from two upward. Die0 402 of FIM 0 includes pages, groups, sets or storage location(s) 402-0, 402-1, 402-2, 402-3, 402-4, 402-5, etc. Similarly, die 0 404 of FIM1 may include pages, groups, sets or storage location(s) 404-0 through 404-5, etc.; die 0 406 of FIM 2 may include pages, groups, sets or storage location(s) 406-0 through 406-5, etc.; and die 0 408 of FIM 3 may include pages, groups, sets or storage location(s) 408-0 through 408-5, etc. In this example, there are a total of N such pages, groups, sets or storage location(s), as shown by the designation Row N-1 435 on die 0 of FIM 0.

Each one or more of the pages, groups, sets or storage location(s) has associated with it corresponding pages, groups, sets or storage location(s) (hereinafter sometimes "group", "set" or "memory location"). For example 402-0, 404-0, 406-0 and 408-0 may form a meta page or meta-set of data that can be simultaneously addressable. Similarly 402-1, 404-1, 406-1, and 408-1 may form an individually addressable meta page, and so on until the second to last meta page that includes memory locations 421N-2, and the last meta page or meta-set 423N-1. It will be appreciated that other configurations involving different addressing schemes, different numbers and/or arrangements of die, different FIMs, an the like are possible without departing from the scope of the present disclosure. While the memory locations corresponding to 402-3, 404-3, 406-3 and 408-3 may be simultaneously addressable as a maximum data width, in various configurations smaller portions or chunks of the memory locations may be addressable. Thus, any given meta-set (e.g., 423N-1) may be written to using a minimum portion of the total amount of data locations in some cases.

For purposes of this disclosure, unless otherwise evident from the context, the terms "memory location" and "memory locations" may be used interchangeably. This definition includes other nomenclature used to describe memory cells, since a single location may either be a single bit, for example, or a series of bits.

As noted from the different textures corresponding to the different rows 0-N, set 402-0 may be in the same addressable meta-set as sets 404-0, 406-0, and 408-0. The similar textures are described herein to identify the individual meta pages or meta-sets. In one embodiment, the controller 123 may be in the process of executing multiple consecutive host writes at each meta page beginning at a simultaneous write operation to sets 402-0 through 408-0 (one meta page or meta-set), then next writing to the meta-page defined by sets 402-1 through 408-1, and sequentially onward. Prior to reaching the 4th meta-page, the controller may detect, for example, that die 0 at FIM 2 has exceeded a maximum temperature. In some embodiments, a plurality of different gradations of maximum temperatures are used. Once the controller detects the temperature is excessive on FIM 2, the controller 123 terminates writes to die 0 at FIM 2 altogether. The controller 123 continues, however, to write at full speed (without throttling) to the remaining memory locations 402-4, 404-4, and 408-4 in one write operation. The controller 123 may then perform a host write to memory locations 402-5, 404-5 and 408-5. The controller may continue to execute successive writes at full speed except by skipping writes to die 0 (that is to say, not writing to memory locations 406-4 and 406-5).

With continued reference to FIG. 4, the other dies 402, 404, and 408 may be utilized at their maximum performance until a time comes wherein the controller 123 determines that the temperature of die 406 has dropped to an acceptable operational range. At that time, the controller may execute writes such as relocation operations to populate memory locations (sets) 406-4 and 406-5 with data.

In short, during an observed temperature rise of any one or more of the dies beyond a permissible temperature, in lieu of effecting a slowdown of writes across the entire meta page (sometimes referenced also as meta block), the controller skips writes only corresponding to those specific die(s). Meanwhile, the performance of the remaining dies is not slowed, and is utilized at 100%. Once the skipped die(s) return to within an operating temperature range, the controller may proceed to utilize all meta pages at full speed and capacity.

The inventors have observed that the aforementioned embodiment and ones like it, where a thermally aging (excess temperature) die 406 is skipped altogether until the temperature goes down and without throttling any other die, has significant advantages over conventional approaches. For example, as described further below with reference to a storage device having a four-die meta page, a 75% increase in performance can be achieved (three of four dies remain fully operational). As the number or array of meta pages increases, a higher performance throughput that exceeds 90% is possible using the principles described herein (see, e.g., FIG. 8). These throughputs exceed conventional throughputs wherein all dies in the meta page are slowed.

Another advantage of the techniques described herein is that in most configurations, the change only uses minimal firmware overhead, without the requirement of additional hardware. This in turn may result in significant cost savings while achieving potentially significant throughput increases. As still another advantage, an early cool down of the die temperature can be effected because the writes (I/O operations) on that specific die are turned off. Thus it is more likely that the die will return to normally operating temperature than in conventional approaches (the latter of which continues to write to the thermally aged die, resulting in the die continuing to generate heat even at lower rates).

In some embodiments, the infrastructure module 131 of FIG. 1 is included on each die and is in thermal communication with each die. When temperature information is provided to the controller 123, the controller may store the thermal mapping data in thermal mapping table 141 in volatile memory. In other embodiments, thermal mapping table may be maintained in addition or alternatively in NVM. The architecture of infrastructure module may also vary depending on the memory configuration and type, all without departing from the scope of the disclosure. In some embodiments, the controller may notify the host processor 101 of excess temperatures, in which case, in those embodiments, the host processor 101 on host device 104 may initiate die shutdown on one or more dies or may provide more general commands to modify performance. The controller 123 on the die may then receive instructions from the host device 104 and implement the instructions in the manner described above.

Figure 5:
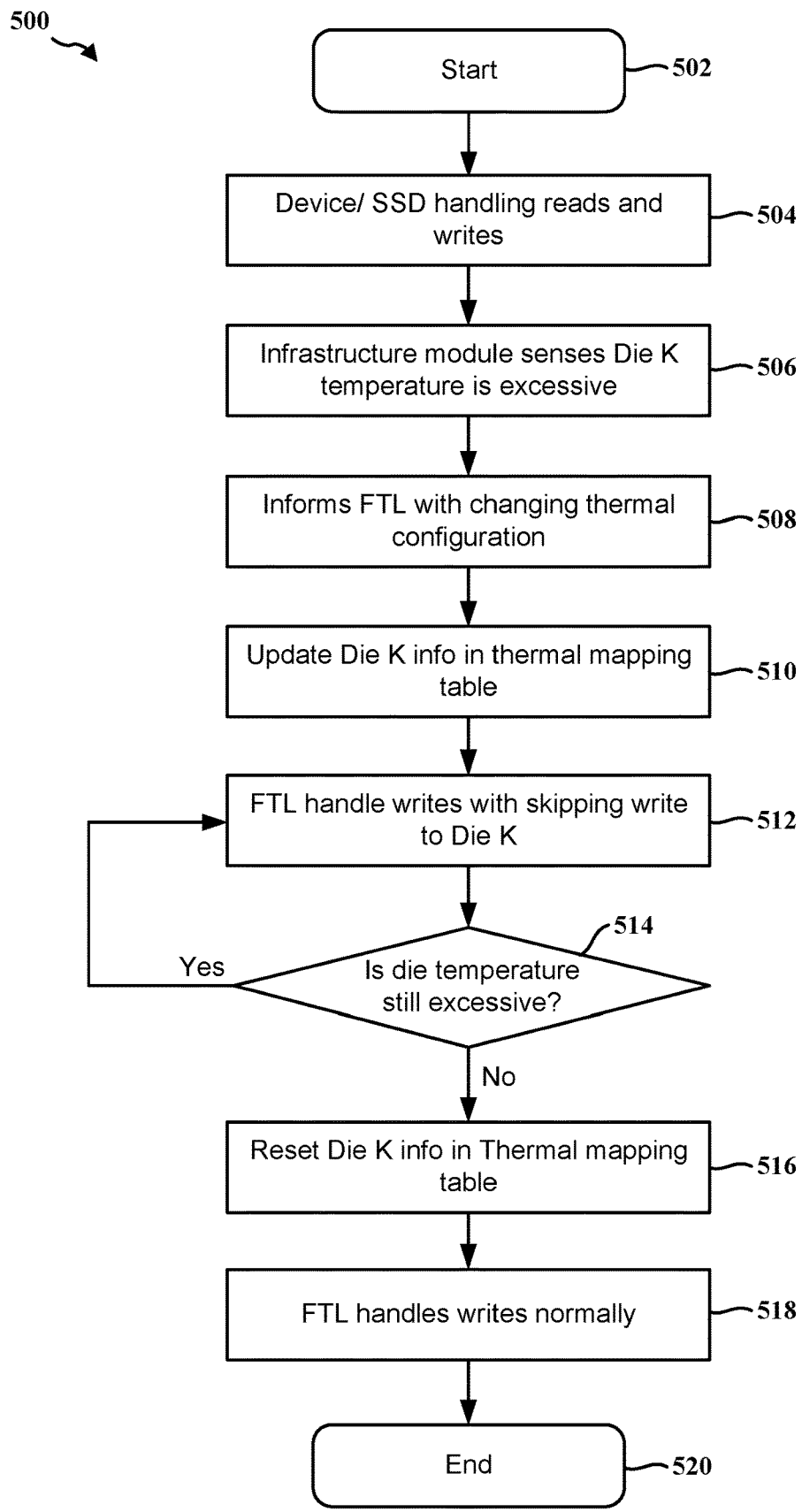
FIG. 5 is a flow diagram showing an example of steps for selective thermal disablement in accordance with an embodiment.

FIG. 5 is a flow diagram 500 showing an example of steps for selective thermal disablement in accordance with an embodiment. The steps of FIG. 5 may be performed by the controller 123 (FIG. 1), for example. The controller may perform steps designated by the FTL or firmware. At block 502, the sequence may start, with control at controller 123. Referring first to block 504, it is assumed that the storage device, such as a solid-state drive, or flash memory, compact flash, and other forms of NVM, is in the process of handling incoming reads and writes from the host device, as well as performing any folding in the case of MLCs.

Thereupon, referring to block 506, it is assumed that the infrastructure module 131 of the die sensed that an operating temperature of Die K, for example is excessive. For instance, it meets or exceeds a defined threshold quantity. The infrastructure module may sense similar information concerning another die. In various embodiments, after sensing the excessive temperature, at block 508, the infrastructure module may inform the controller 508, e.g. via the FTL, of the change in the thermal configuration.

With continued reference to FIG. 5, as shown at block 510, the controller may update the temperature information received from the infrastructure module in the thermal mapping table 141. Also, as shown with reference to block 512 of FIG. 5, the controller 123 (via the FTL or otherwise) may begin to handle selective writes including skipping writes to the affected die K while maintaining full capacity writes to the other dies (e.g., the other memory locations), in a manner described above. It should be noted that the infrastructure module may differ depending on the configuration and may be implemented, for example, as a simple circuit configured to sense die temperatures.

In various embodiments, the controller may check periodically or continuously on the status of the temperature of example die K to determine whether it is still excessive. This checking is demonstrated by the diamond 514. If the temperature remains excessive, control returns to the box 512, where the controller continues to execute writes or other I/O or internal operations at full capacity while disabling (skipping writes or other operations) to die(s) K (e.g., the memory location or set thereof that is otherwise part of a larger meta-set or meta page traversing a plurality of dies). A plurality of dies that include meta-set or meta pages that can be individually addressed may also be used in a manner consistent with the principles described herein.

If, at diamond 514 the controller determines that die(s) K has returned to normal operating range, the controller may return die K(s) to full functionality. In various embodiments, as shown at block 516, the controller may reset the die K thermal information by updating the thermal mapping table. Contemporaneously or subsequently, the controller 123 may (via the FTL or otherwise) return to handling writes normally. This change may entail simultaneous performing host writes to all sets in all dies within a given meta-die. This change may in various embodiments also entail executing relocations of data to the void locations in die K that were skipped while die K was disabled, as described further below with reference to FIG. 9. The process may end at block 520.

It will be appreciated by those skilled in the art upon review of the present disclosure that the sequence of events in FIG. 5 may take place in different orders in various embodiments. For example, in some embodiments, the controller may perform the steps in blocks 510 and 512 simultaneously. Other embodiments and variations are also possible. Except for the skipped die(s) K, no throttling of performance is implemented.

In sum, as shown in FIG. 5, during a host write or sequential sustained writes (SSWs), whenever the temperature of at least one die becomes excessive, the infrastructure module informs the FTL layer of same. Based on the received message by the controller via the FTL, the controller can understand which meta-die(s) (e.g., plurality of dies) of the plurality of meta-dies (if more than one meta-die) is at issue, and which die(s) within that plurality has an excessive temperature. In some embodiments, more than one die is detected to have an excessive temperature, in which case writes to the subject dies will be skipped while full performance is maintained to the other dies within the meta-die (including the meta-sets, meta-pages, meta-blocks, etc. within that meta-die) with the excessive temperature that traverses the subject plurality of dies. In cases where more than one meta-die group is affected, the controller may perform the same set of functions on multiple meta-dies, disabling those dies with an excess temperature.

In various embodiments involving large arrays of dies (NAND, NOR, SSD, flash, etc.), the controller 123 may include a plurality of controllers, each of which may coordinate with one another to perform the actions described above. That way, the principles of the present disclosure can apply to meta-dies of arbitrary size and complexity.

In another aspect of the disclosure, after the controller closes a host written data block (e.g., location(s) on one of the meta-sets), the controller may be configured to relocate data to the previously skipped sets/blocks of the meta-sets of a meta-die to achieve optimal read performance, among other benefits. In various embodiments, to implement this series of steps, a thermal relocation state machine can be employed such that the blocks or meta-sets to which a lesser number of die(s) were written to due to the excess temperature(s) may be repopulated with data. In this manner, host reads can be maximized to include data in an entire meta page.

In these embodiments, a bit map may be obtained in the log tables, such as along with the thermal mapping table in NVM or cached in volatile memory (or both). The bit map may be part of the thermal mapping table or separate. The bit map in the log tables may in some examples be included in, or adjacent, the L2P mapping table in NVM. The bit map may also be used in connection with SLC or MLC (e.g., TLC, QLC, PLC, etc.) memory architectures. The bit map may be obtained such that, once the closed SLC block becomes a candidate for relocation operations due to the thermal information (below excessive) and its priority is less than read scrub (RS) and more than static relocation, for example. Priority levels may vary based on the design.

Figure 6:
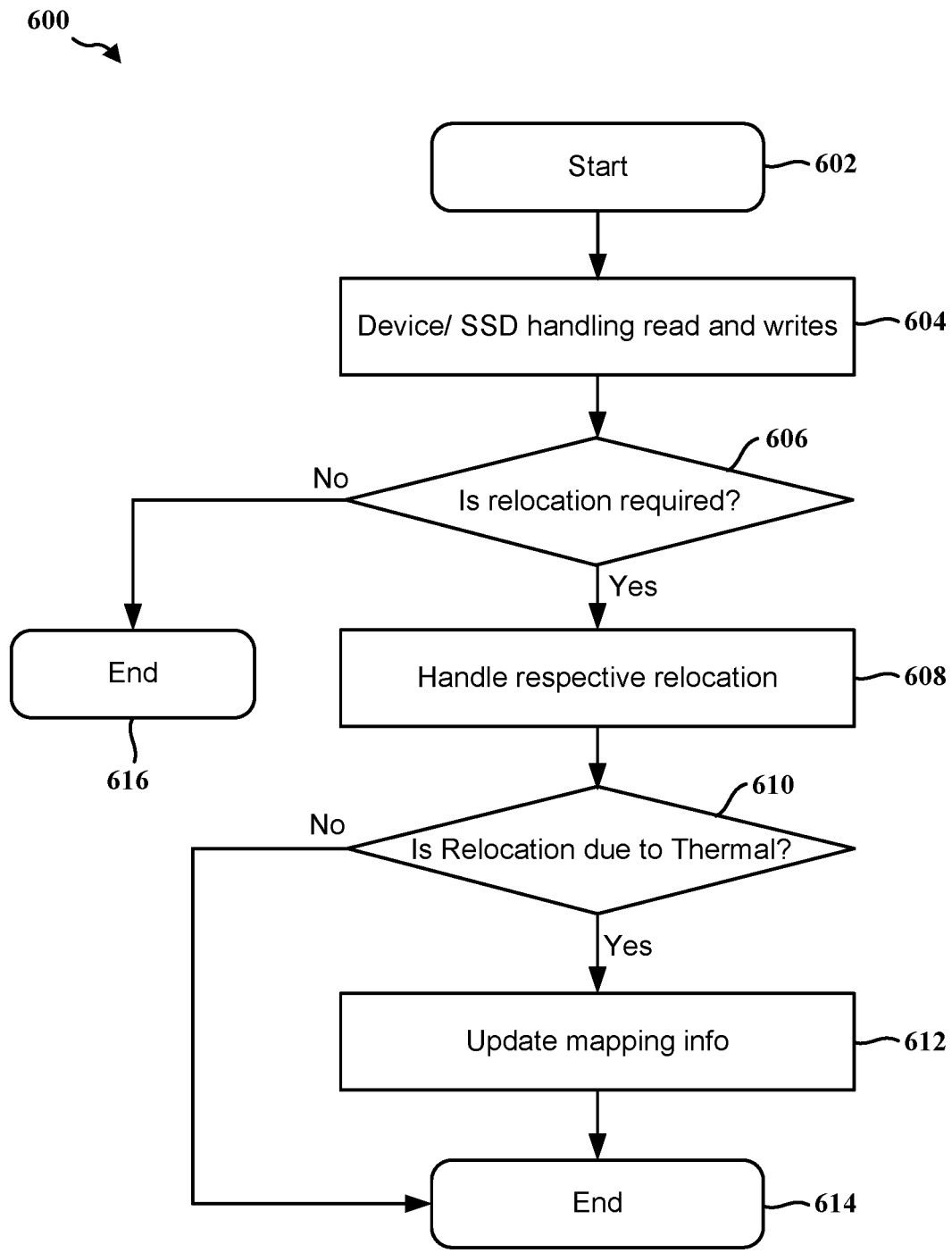
FIG. 6 is a flow diagram showing an example of steps for selective thermal disablement during relocation in accordance with an embodiment.

FIG. 6 is a flow diagram 600 showing an example of steps for selective thermal disablement during relocation in accordance with an embodiment. In FIG. 6, it may be assumed that the temperature of die K has returned to within a normal range of operation. Starting at block 602, the storage device, such as an SSD, may return to handling reads and writes as normally prescribed, with access to whole meta pages.

Referring to block 606, the controller may determine whether relocation is recommended or necessary. Examples of relocation types may include, for example, SLC relocation, RS relocation, thermal relocation, SLC-SLC static relocation, SLC-SLC dynamic relocation, SLC-QLC fold, QLC-QLC static relocation, QLC-QLC dynamic relocation, and the like, depending on the memory architecture. Upon determining the necessary types of relocation and priority relating thereto, the controller executes operations to handle the respective relocation, such as in order of priority as determined via one or more of the bit map, log tables, and thermal mapping table.

After executing the respective relocation operations, the controller may be configured to determine, such as at diamond 610, whether any of the relocation operations were thermal operations, such that memory locations on die K that were skipped were then filled, for example. If not, control may end at block 614. If, conversely, thermal relocations occurred, the thermal mapping table and/or bit map may be respectively updated at block 612 to account for the thermal read locations.

In sum, this aspect of the disclosure also increases read performance, In the example of FIG. 5 where die K was disabled due to the excessive temperature, then conventionally if a host read instruction is received, the data is read from three FIMs instead of four FIMs, which impacts read performance. In the embodiment of FIG. 6, thermal relocations can populate the memory locations on the skipped die(s) at full capacity. Any host reads on the same set of meta dies will result in the host receiving the data from four FIMs (four dies in this example) instead of three. Thus after closing the host written data block, the disabled die(s) can be relocated as soon as possible to make it available to read via four FIMs during an ensuing host read to maximize performance.

Figure 7:
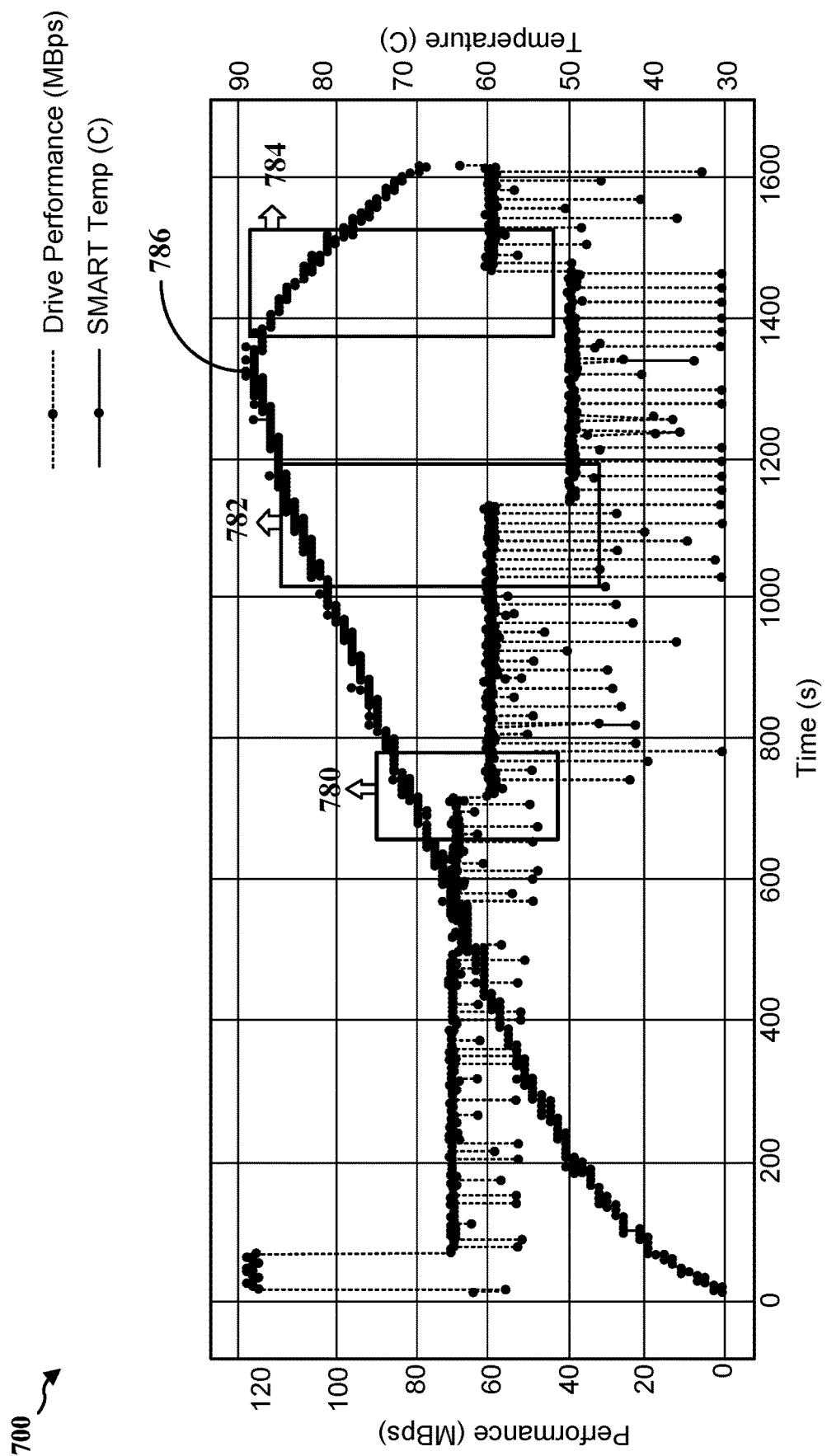
FIG. 7 is an example graph showing performance of a NAND-based solid state drive (SSD) as a function of time and temperature.

FIG. 7 is an example graph 700 showing performance of a conventional NAND-based solid state drive (SSD) as a function of time and temperature. While the details of a NAND-based SSD are described for exemplary purposes, other memory architectures may demonstrate similar behavior. The purpose of FIG. 7 is to demonstrate the reduced performance when conventional throttling is employed. With reference to FIG. 7, there are two plots shown, as described by the legend in the above right. To that end, the vertical axis on the right corresponds to temperature in degrees centigrade. This vertical axis is specifically applicable to the SMART temperature (C) data plot, which is solid. The vertical axis on the right corresponds to storage device performance (i.e. write speed) in Megabytes/second (MBps) and is directed to the dashed plot line styled Drive Performance (MBps) in the legend. The horizontal axis refers to time in seconds and applies to both plots.

Various events occur on the graph at 780, 782 and 784, and are explained below. At initially lower and normal temperatures ranging from approximately 30° C. to just below 70° C., a higher performance of up to about 72 MBps can be obtained. At event 780, when the temperature reaches 70° C. on one of the dies, the host may initiate, and the controller 123 may responsively perform, initial throttling of all dies of the meta die. This initial throttling corresponds with the first downgrade in performance (e.g., to TMT1) as the write speeds of all dies are reduced to close to about 57 MBps. As the host writes continue at the first reduced rate, temperatures may continue to increase.

Referring still to FIG. 7, at event 782, the controller determines that the temperature of at least one of the dies in the subject meta-die has crossed 85° C. Throttling is therefore increased by the next gradation (e.g. to ETT), and a much larger performance hit results as the write speeds across all die reduce to below 40 MBps. Finally, as shown by the peak temperature at 786 just below 90° C., the temperature finally begins to reduce. As the temperature reduce to about 80-85° C., the controller may reduce throttling back to TMT1, and the write speed performance in this example increases to approximately just below 60 MBps.

In sum, during normal temperature the NAND speed is about an even 75 MBps. During high temperatures of approximately 90° C., the performance can drop to a worst case by 50%, which is an impact across all dies, meaning the overall performance dip using conventional methods is approximately 50%.

Figure 8:
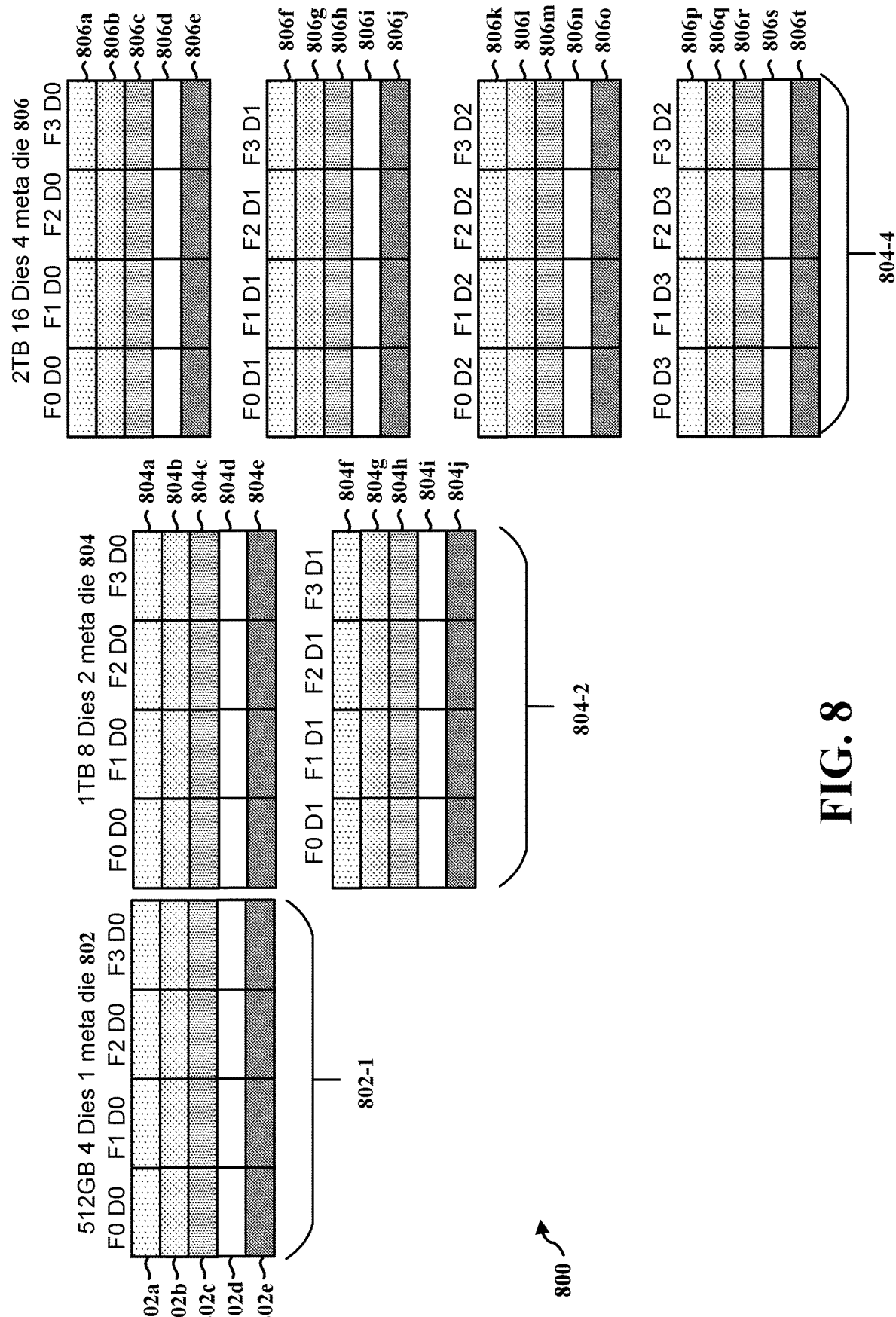
FIG. 8 is a block diagram showing three exemplary storage devices of different capacities in accordance with an embodiment.

FIG. 8 is a block diagram 800 showing three exemplary storage devices 802-1, 804-2 and 804-4 of different capacities in accordance with an embodiment. FIG. 8 is exemplary in nature. Different numbers of addressable die and different capacities are equally possible across different memory architectures. The storage device 802-1 on the left includes NVM of one meta die 802. The one meta die 802 corresponds to four dies in this example, including F0 D0, F1 D0, F2 D0 and F3 D0. The meta die 802 on the left may correspond to a 512 GB storage device. The identical textures in each row (or absence thereof) represent simultaneous input/output (I/O) operations that can take place on different ones of the dies. In this example, a total number of meta pages 802a-802e are available. In various implementations, writes to individual dies D0, or writes to portions of dies D0, are possible.

Storage device 804-2 may refer to a one terabyte (TB) device including, for purposes of example, two meta dies 804. The two meta dies 802 are arranged in an array of separately addressable meta pages 804*a*-804*j* are available. The two meta dies 804 of storage device 804-2 include a total of eight (8) dies, four (4) dies on each meta die. Storage device 804-4 may refer to a two terabyte (TB) device including four (4) meta dies 806. Addressable meta pages may include meta pages 806*a* through 806*t*. Storage device 804-4 includes a total of sixteen dies, four dies for each meta die of the four meta dies 806.

It is noteworthy in the exemplary embodiment of FIG. 8 that, in contrast with the conventional throttling as discussed with reference to FIG. 7, a much higher write performance can be achieved. As an example, referring to storage device 802-1, assuming die F1 D0 is disabled on all five rows 802*a*-3, a total throughput performance of ¾ or 75% can still be achieved because the other three dies are operating at full host write capacity. Referring next to the example of storage device 804-2, assuming die F1 D1 has an excessive temperature and is disabled throughout the five meta-pages 804*f*-*j*, a total throughput performance of ⅞ or 87.5% remains achievable by operating the other seven dies at full capacity. Referring to the remaining example storage device 804-4, assuming similarly that die F2 D3 is disabled for all five meta pages 806*p*-*t*, the remaining ¹⁵⁄₁₆ dies, operating at full capacity, can achieve a 93.7% throughput using the principles of the disclosure. This is true even at extreme temperatures.

In short, a range of between 75% (one meta die capacity) to 93% (four meta die capacity) overall throughput can be obtained on the example devices shown. In other configurations involving greater numbers of meta dies, still higher performances may be possible. These performance can be implemented with minimal firmware overhead and generally without additional hardware. Further, as noted, the disabled die(s) can expect an earlier cool down precisely because the die(s) is disabled from operating, and does not independent dissipate much heat, if any, as a result. Thus the turn-off or disabled time for a specific die or dies can be much shorter in time, after which it/they can be reactivated. Further, in some embodiments to maximize host read performance, data can be relocated in the skipped memory locations of the disable die(s). Ensuing reads may then obtain the benefit of a maximum amount of data received at a single time.

Figure 9:
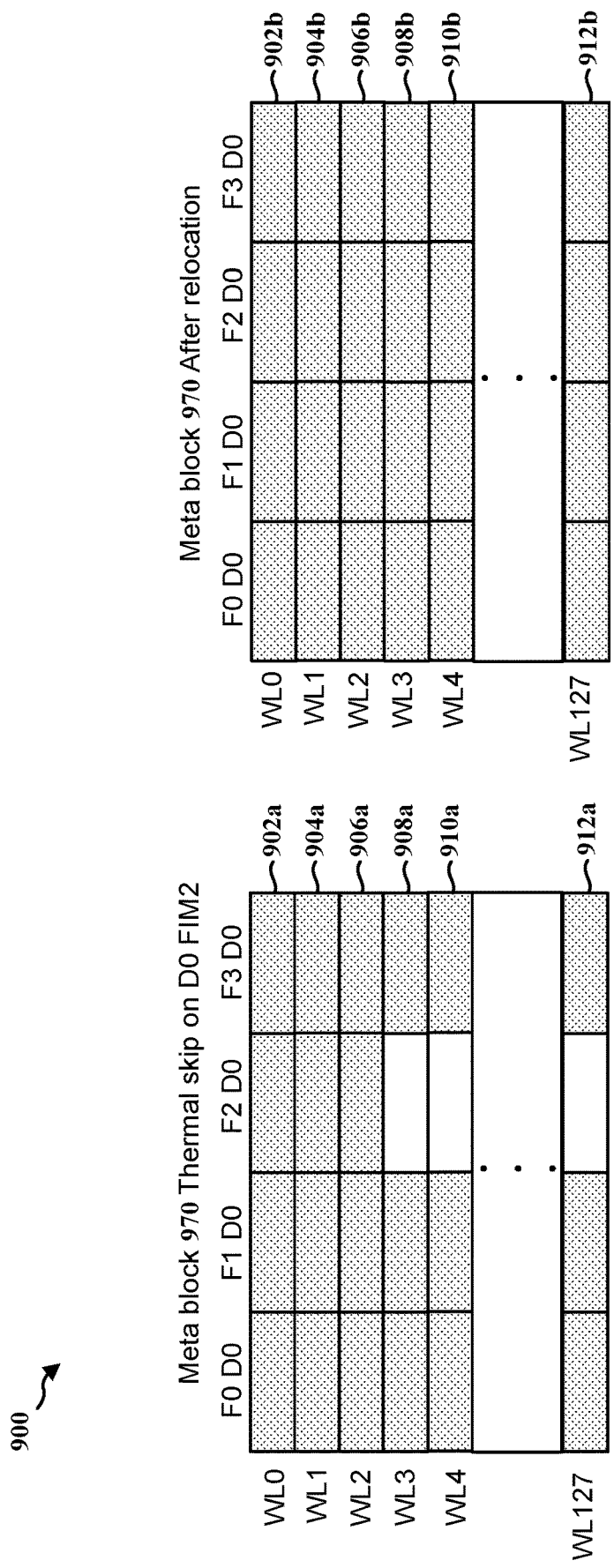
FIG. 9 is a block diagram illustrating another example of data relocation after the temperature on a skipped die(s) returns to thermal operational range.

FIG. 9 is a block diagram 900 illustrating another example of data relocation after the temperature on a skipped die returns to an acceptable thermal operating range. FIG. 9 shows an exemplary meta block 970. The meta block 970 includes 128 word lines (WLs), from WL0 to WL127. The meta block 970, in turn, includes four dies—F0 D0, F1 D1, F2 D2, and F3, D3. It is assumed for this exemplary embodiment that after full host writes to WLs 0-2, the controller detects from the infrastructure module an excess temperature on die F2 D0 and disables die F2 D0 while continuing a sequence of host writes (e.g., SSWs) from WL3 through WL 127 on each of the three remaining die at full capacity, without throttling. Full capacity may be the same capacity as writes occurred before die F2 D0 was disabled, or more simply, 100% capacity of writes on the storage device.

After conducting the sequential writes at full capacity while disabling die F2 D0 from memory locations WL3-WL127 due to an excess temperature on the die F2 D0, the controller may determine to relocate data to die F2 D0 once the temperature drops to within operational range. The right side of FIG. 9 shows meta block 970 after the relocations have taken place. Because all die in the meta block are filled with data, subsequent host reads increase in efficiency. Overall performance is increased.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a plurality of dies each comprising a plurality of memory locations, corresponding memory locations from each die forming an addressable group such that a plurality of addressable groups traverse the plurality of dies; and
   a controller in thermal communication with each of the dies and configured to:
   detect an excess temperature on at least one of the dies while performing sequential host writes;
   disable all writes to the at least one detected die while continuing to perform writes to the memory locations of the other dies corresponding to one or more of the addressable groups; and
   reactivate writes to the at least one detected die when the temperature drops below a threshold.

2. The device of claim 1, wherein the controller is configured to continue performing the host writes to the other dies at a maximum capacity while the at least one detected die is disabled.

3. The device of claim 1, wherein the controller is configured to continue performing the host writes to the other dies while the at least one detected die is disabled without throttling the other dies.

4. The device of claim 1, further comprising an infrastructure module configured to communicate thermal information to the controller, wherein the infrastructure module identifies the at least one die having the excess temperature.

5. The device of claim 1, wherein the controller is configured to execute a function at a flash translation layer (FTL) to disable the writes to the at least one detected die.

6. The device of claim 1, wherein the controller is further configured to update thermal information of the at least one detected die in a thermal mapping table.

7. The device of claim 6, wherein the controller is further configured to update the thermal mapping table when the temperature drops below the threshold.

8. The device of claim 6, wherein in response to a relocation responsive to a thermal write disable operation, the controller is configured to perform the relocation and update the thermal mapping table.

9. The device of claim 8, wherein the controller is configured, based on the updated thermal mapping table, to perform a find last good page (FLGP) action in a recovery after an ungraceful shutdown (UGSD) event.

10. A storage device, comprising:
a plurality of dies each comprising n sets of memory locations, a corresponding one of the n sets from each die coupled together to form one meta-set of n meta-sets, each meta-set comprising a maximum addressable unit of a host input/output (I/O) operation; and
a controller in thermal communication with each of the dies and configured to:
detect an excess temperature on at least one of the dies while performing a sequence of host writes;
disable all writes to the detected at least one die while continuing the host writes to the other dies in the corresponding one or more of the n meta-sets; and
re-activate writes to the detected at least one die when the temperature drops below a threshold.

11. The device of claim 10, wherein the controller is configured to continue performing the host writes to the other dies at full capacity while the at least one detected die is disabled.

12. The device of claim 10, wherein the controller is configured to continue performing the host writes to the other dies without throttling the other dies while the at least one detected die is disabled.

13. The device of claim 10, wherein during a disabled state of the at least one detected die, the controller is configured to disable writes to the memory locations in the sets corresponding to the at least one detected die while executing host writes without throttling to memory locations in the other sets on other dies within one or more of the n meta-sets.

14. The device of claim 10, further comprising an infrastructure module configured to communicate thermal information to the controller, wherein the infrastructure module identifies the at least one die having the excess temperature.

15. The device of claim 14, wherein the controller is further configured to update thermal information of the at least one detected die in a thermal mapping table.

16. The device of claim 15, wherein the controller is further configured to update the thermal mapping table when the temperature drops below the threshold.

17. A storage device, comprising:
a plurality of dies each comprising a memory location forming one of a plurality of selectively addressable pages;
a controller coupled to each of the plurality of dies and configured to:
perform a host write operation to one or more pages;
detect an excess temperature on at least one of the dies;
disable, responsive to the detection, all writes to the detected at least one die while continuing to perform writes to the memory locations of the other dies; and
reactivate writes to the detected at least one die when the temperature drops below a threshold.

18. The device of claim 17, wherein the controller is further configured to continue performing writes to the memory locations of the other dies at a same write speed as prior to the detection of the excess temperature.

19. The device of claim 17, wherein the controller is further configured to continue performing writes to the memory locations of the other dies without throttling.

20. The device of claim 17, wherein the controller is further configured to reactivate the writes to the detected die at a same speed as the writes to the other dies in the one or more pages.

* * * * *